(12) United States Patent
Du et al.

(10) Patent No.: US 11,869,899 B2
(45) Date of Patent: Jan. 9, 2024

(54) GOA CIRCUIT, ARRAY SUBSTRATE AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Ruifang Du, Beijing (CN); Lanzhou Ma, Beijing (CN); Haijiao Qian, Beijing (CN); Xiaoye Ma, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 275 days.

(21) Appl. No.: 17/357,841

(22) Filed: Jun. 24, 2021

(65) Prior Publication Data
US 2022/0102383 A1 Mar. 31, 2022

(30) Foreign Application Priority Data
Sep. 27, 2020 (CN) .......................... 202022181710.2

(51) Int. Cl.
*H01L 27/12* (2006.01)
*H01L 23/60* (2006.01)
*H01L 25/18* (2023.01)

(52) U.S. Cl.
CPC ............ *H01L 27/124* (2013.01); *H01L 23/60* (2013.01); *H01L 25/18* (2013.01)

(58) Field of Classification Search
CPC .................................................. H01L 27/124
See application file for complete search history.

(56) References Cited

U.S. PATENT DOCUMENTS

| | | | |
|---|---|---|---|
| 2020/0211436 A1* | 7/2020 | Yuan | ........................ G09G 3/20 |
| 2022/0130867 A1* | 4/2022 | Xi | ........................ H01L 27/1225 |
| 2023/0144117 A1* | 5/2023 | Xue | ........................ H01L 27/124 |
| | | | 345/206 |

FOREIGN PATENT DOCUMENTS

CN 107785350 * 3/2018 ............... H02H 9/00

* cited by examiner

*Primary Examiner* — Sang V Nguyen
(74) *Attorney, Agent, or Firm* — McCoy Russell LLP

(57) ABSTRACT

The present disclosure provides a GOA circuit, an array substrate and a display device, wherein the GOA circuit comprises: a GOA area, and the GOA area comprises a plurality of GOA unit circuits cascaded with each other; a lead area, wherein at least one STV signal line and at least one non-STV signal line are arranged in the lead area, each STV signal line and each non-STV signal line is connected to at least one GOA unit circuit, and the non-STV signal line comprises at least one of a Vdd signal line, a Clk signal line, a VGH signal line and a VGL signal line; a projection of the at least one STV signal line on the lead area does not overlap a projection of the at least one non-STV signal line on the lead area.

11 Claims, 4 Drawing Sheets ns. It should be understood that the specific embodiments described herein are only used to explain the present disclosure, not to limit the present disclosure.

GOA CIRCUIT, ARRAY SUBSTRATE AND DISPLAY DEVICE

CROSS-REFERENCE TO RELATED APPLICATION

The present application claims priority to Chinese Patent Application No. 202022181710.2 filed on Sep. 27, 2020. The entire contents of the above-listed application is hereby incorporated by reference for all purposes.

TECHNICAL FIELD

The present disclosure relates to the field of display technology, and more particularly to a GOA circuit, an array substrate and a display device.

BACKGROUND

Gate on Array (GOA) technology is used in display products. As the size of the products increases, the signal lines are lengthened, and Electro-Static discharge (ESD) is easy to occur during the production process and process test. In particular, ESD occurs in oxide TFT products with a higher ratio than a-Si TFT products.

SUMMARY

The present disclosure provides a GOA circuit comprising:
a GOA area, wherein the GOA area comprises a plurality of GOA unit circuits cascaded with each other; and
a lead area, wherein at least one STV signal line and at least one non-STV signal line are arranged in the lead area, each STV signal line and each non-STV signal line is connected to at least one GOA unit circuit, and the non-STV signal line comprises at least one of a Vdd signal line, a Clk signal line, a VGH signal line and a VGL signal line;
a projection of the at least one STV signal line on the lead area does not overlap a projection of the at least one non-STV signal line on the lead area.

In some embodiments, the GOA circuit further comprises an electro-static discharge electrode disposed at a different layer from the STV signal line, a projection of the electro-static discharge electrode on the lead area overlaps a projection of the STV signal line on the lead area.

In some embodiments, the electro-static discharge electrode is a serpentine structure, and a width of a coverage area of the electro-static discharge electrode of the serpentine structure is not less than a width of the STV signal line.

In some embodiments, the STV signal line and the non-STV signal line are respectively connected to a driver chip.

In some embodiments, the GOA circuit further comprises an auxiliary signal line spaced from the STV signal line;
one end of the auxiliary signal line is connected to the driver chip, and the other end is electrically connected to the electro-static discharge electrode;
a projection of the auxiliary signal line does not overlap on the lead area the projection of the non-STV signal line on the lead area.

In some embodiments, the auxiliary signal line and the STV signal line are connected to a same signal output port of the driver chip.

In some embodiments, the STV signal line is formed in a same layer and with same material as one of a gate layer or a source electrode and drain electrode layer of a transistor in the GOA circuit;
the auxiliary signal line is formed in a same layer and with same material as one of the gate layer or the source electrode and drain electrode layer of the transistor in the GOA circuit;
the electro-static discharge electrode is formed in a same layer and with same material as one of the gate layer or the source electrode and drain electrode layer of the transistor in the GOA circuit, and the electro-static discharge electrode is disposed in a different layer from the STV signal line.

In some embodiments, the STV signal line and the auxiliary signal line are disposed in a same layer, and the auxiliary signal line is electrically connected to the electro-static discharge electrode through a first via hole.

Alternatively, in some embodiments, the STV signal line and the auxiliary signal line are disposed in different layers, and the auxiliary signal line is electrically connected to the electro-static discharge electrode.

In some embodiments, the GOA circuit further comprises a common electrode area located at the lead area away from the GOA area;
the STV signal line is led out from the driver chip and extends in a first direction of the common electrode area, bypassing the non-STV signal line and extending to the GOA area in a second direction of the common electrode area to electrically connect with the at least one GOA unit circuit, the first direction being perpendicular to the second direction.

A second aspect of the present disclosure provides an array substrate comprising the GOA circuit described above.

A third aspect of the present disclosure provides a display device comprising the array substrate described above.

BRIEF DESCRIPTION OF THE DRAWINGS

The specific implementations of the present disclosure will be described in further detail below in conjunction with the accompanying drawings.

DETAILED DESCRIPTION

Figure 1:
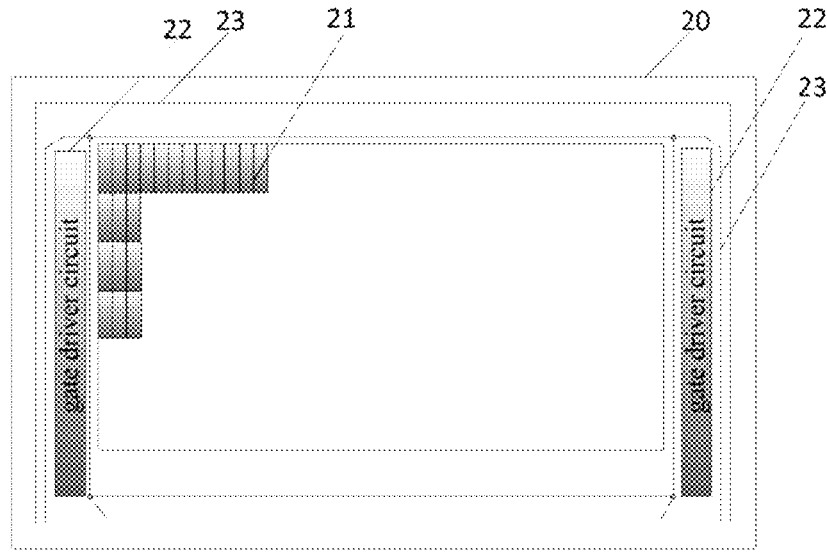
FIG. 1 shows a schematic diagram of an array substrate comprising a gate driver circuit in the related art.

To more clearly illustrate the present disclosure, a further description of the disclosure is provided below in connection with preferred embodiments and the accompanying drawings. Like parts in the drawings are denoted by the same reference numerals. It is to be understood by persons of ordinary skill in the art that the following detailed description is illustrative and not restrictive, and is not intended to limit the scope of the present disclosure.

It should be noted that the terms "on", "formed on", and "disposed on" as used herein may mean that one layer is formed or disposed directly on another layer, or that one layer is formed or disposed indirectly on another layer. That is, there are additional layers between the two layers. As used herein, unless otherwise specified, the term "in the same layer" means that two layers, components, members, elements or parts may be formed by the same patterning process, and that the two layers, components, members, elements or parts are generally formed of the same material.

Figure 2:
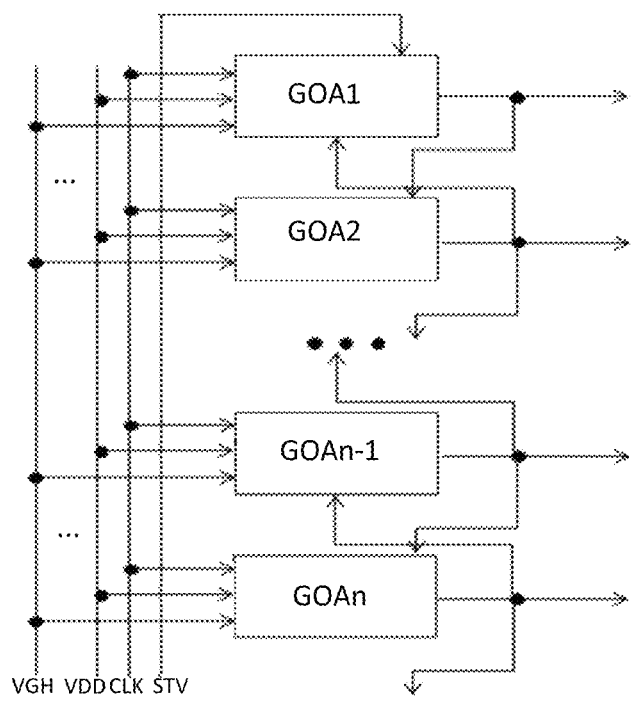
FIG. 2 shows a schematic diagram of a GOA circuit in the related art.
Figure 3:
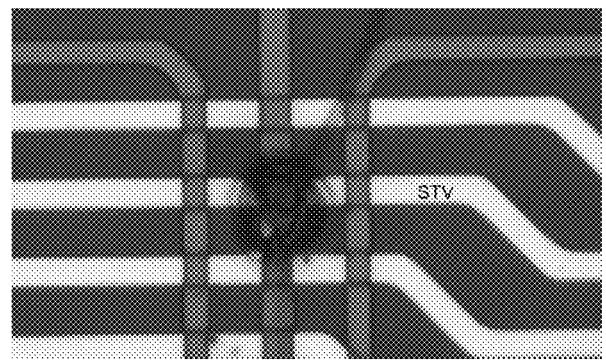
FIG. 3 shows a schematic diagram of ESD breakdown on a GOA circuit in the related art.

As shown in FIG. 1, a schematic diagram of an array substrate 20 having a gate driver circuit (GOA) is shown, comprising a display area 21, a gate driver circuit 22 and a lead area 23, etc. and as shown in FIG. 2, a cascade schematic diagram of the gate driver circuit is shown, comprising a plurality of cascaded GOA units, and a plurality of signal lines accessing each GOA unit. It can be seen from the figures that the STV signal line overlaps with other signal lines. In the actual production process, the STV signal line is prone to ESD problems at the position where it overlaps with other signal lines due to the characteristics of few signal connection points and long signal line, as shown in FIG. 3. For example, a gate insulation layer (GI) breaks down when an ESD occurs at a position where an STV signal line overlaps other signal lines, resulting in a short circuit between the signal lines after the overlapping area breaks down.

In view of the ESD problem existing in the GOA wiring of the display device in the related art, the present disclosure provides a GOA circuit, an array substrate and a display device capable of bypassing non-STV signal lines arranged overlapping in the GOA circuit by optimizing the wiring position of the STV signal lines. Therefore, the electro-static discharge caused by the overlapping of STV signal lines and non-STV signal lines due to the crossing arrangement is avoided, and the anti-static performance of the GOA circuit is improved. In particular, an electro-static discharge electrode corresponding to the STV signal line is further provided, and it is possible to effectively discharge the electric charge accumulated on the STV signal line outside the GOA area and to further reduce the electro-static risk by an auxiliary signal line arranged side by side with the STV signal line.

Figure 4:
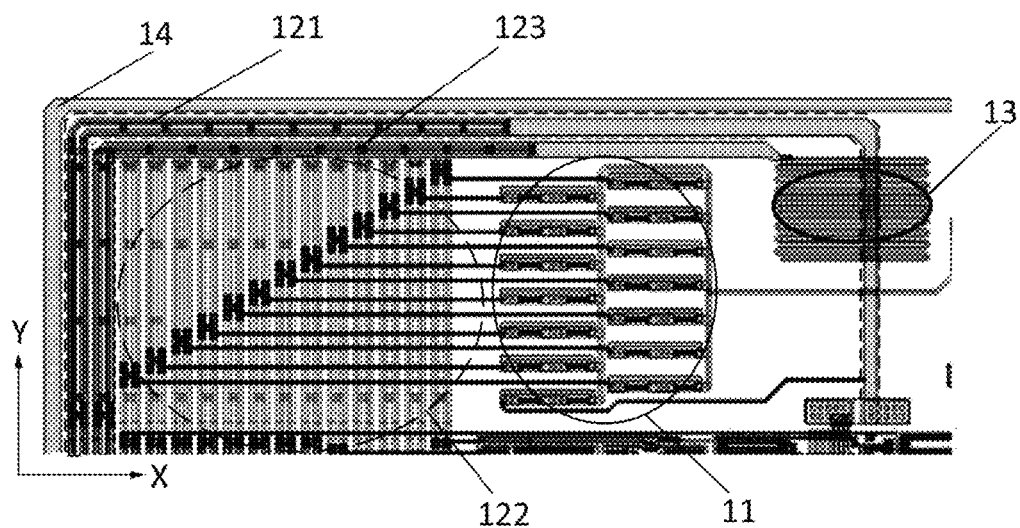
FIG. 4 shows a schematic diagram of a GOA circuit according to an embodiment of the present disclosure.
Figure 5:
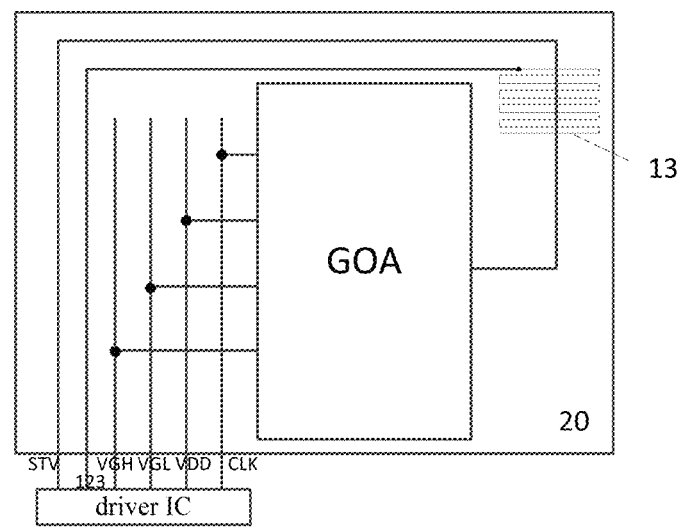
FIG. 5 shows a circuit schematic diagram of a GOA circuit according to an embodiment of the present disclosure.

As shown in FIGS. 4 and 5, one embodiment of the present disclosure provides a GOA circuit comprising a GOA area 11 comprising a plurality of GOA unit circuits cascaded to each other; a lead area, wherein at least one STV signal line 121 and at least one non-STV signal line 122 are arranged in the lead area, each STV signal line 121 and each non-STV signal line 122 is connected to at least one GOA unit circuit and the non-STV signal line comprises at least one of a Vdd signal line, a Clk signal line, a VGH signal line and a VGL signal line;

a projection of the at least one STV signal line 121 on the lead area does not overlap a projection of the at least one non-STV signal line 122 on the lead area.

In the present embodiment, in consideration of such characteristics as a small number of signal connection points and a long signal line of the STV signal lines, the STV signal lines are arranged in a area away from the non-STV signal lines while bypassing the non-STV signal lines. Thus, the projections of the STV signal line and the non-STV signal line on the lead area are prevented from overlapping, so that the ESD problem caused by the overlapping arrangement of the STV signal line and the non-STV signal line can be solved, and the anti-static performance of the GOA circuit can be effectively improved.

In some embodiments, the STV signal line and the non-STV signal line are connected to the driver chip, respectively.

Specifically, the driver chip has at least the function of a timing controller (TCON), and the timing controller leads out a plurality of signal lines, comprising an STV signal line, and non-STV signal lines such as one or more of a Vdd signal line and a Clk signal line, a VGH signal line and a VGL signal line, wherein the plurality of signals are led out from the timing controller and extend in the arrangement direction of the plurality of GOA unit circuits in the GOA area and are electrically connected to each GOA unit circuit of the GOA area according to the signal direction. Wherein, the non-STV signal line 122 is close to the GOA area 11, and the STV signal line 121 is provided at a position where the non-STV signal line is away from the GOA area so as to bypass the non-STV signal line; thus, the projections of the STV signal line and the non-STV signal line on the lead area are not overlapped, the ESD risk of the STV signal line is reduced, and the anti-static performance of the GOA circuit is improved.

It should be noted that the present embodiment is merely used for illustrating the specific implementations of the present application, and the specific structure of the GOA circuit and the specific signal line are not particularly limited, and the GOA circuit can be other circuit structures with a gate driver function, the signal line is a signal line used in combination with a GOA circuit, and a person skilled in the art would have chosen an appropriate GOA circuit structure and signal line according to practical application requirements, and the description thereof will not be repeated here.

In some examples, as shown in FIG. 4, the GOA circuit further comprises a common electrode area 14 located at the lead area away from the GOA area; the STV signal line is led out from the driver chip and extends in a first direction of the common electrode area, bypassing the non-STV signal line and extending to the GOA area in a second direction of the common electrode area to electrically connect with the at least one GOA unit circuit, the first direction being perpendicular to the second direction.

In the present embodiment, the common electrode area 14 is arranged at an edge position away from the GOA area so as to ensure that the STV signal line can effectively bypass the non-STV signal line and be electrically connected to at least one GOA unit of the GOA area. As shown in FIG. 4, the STV signal line 121 is arranged along the common electrode.

Note that the common electrode area is an area provided with a common electrode, and the common electrode of the layout of the common electrode area is an electrode of a peripheral area of the display panel, which may be an electrode connected to the common electrode for display in the display area or a dummy electrode.

Specifically, the STV signal line extends in a first direction Y of the extending direction of the common electrode signal line after being led out from the driver chip, and when the wiring direction of the common electrode signal line turns to a second direction X, the STV signal line extends in the second direction X, wherein the first direction is perpendicular to or at an angle to the second direction. The STV signal line thereby bypasses the layout area of the non-STV signal line, and the STV signal line is electrically connected to the GOA area at a side of the GOA area away from the non-STV signal line; therefore, the anti-static performance of the GOA circuit can be effectively improved by setting the STV signal lines staggered in space and no overlapping with the non-STV signal lines.

On the basis of the above-mentioned GOA circuit, in an alternative embodiment, as shown in FIGS. 4 and 5, the GOA circuit further comprises an electro-static discharge electrode 13 disposed in a different layer from the STV signal line 121. There is an overlap area between the electro-static discharge electrode 13 and the portion of the STV signal line 121 that bypasses the non-STV signal line 122 and extends to the GOA area 11.

In the present embodiment, the electro-static discharge electrode 13 is arranged at a position away from the non-STV signal line in the GOA area in the GOA circuit, and the electro-static discharge electrode 13 is disposed in a different layer from the STV signal line. That is, the forward projection of the electro-static discharge electrode 13 onto the substrate of the GOA circuit partially overlaps with the forward projection of the portion of the STV signal line 121 that bypasses the non-STV signal line 122 and extends to the GOA area 11 onto the substrate of the GOA circuit. Namely, a capacitor is formed by providing the electro-static discharge electrode 13, the STV signal line and an insulation layer (such as a gate insulation layer) located between the electro-static discharge electrode 13 and the STV signal line, so that when the insulation layer breaks down, the electric charge accumulated on the STV signal line is effectively discharged through the electro-static discharge electrode 13.

In some embodiments, the electro-static discharge electrode may be a serpentine structure, and a width of a coverage area of the electro-static discharge electrode of the serpentine structure is not less than a width of the STV signal line.

Specifically, as shown in FIG. 4, the electro-static discharge electrode is a metal line with a certain length and width arranged in the GOA circuit, and before the STV signal line is connected to the GOA area, the STV signal line further releases the electric charge accumulated on the STV signal line by forming a capacitor with a metal line having a certain width (the width being greater than or equal to the width of the STV signal line) as a whole so as to alleviate the ESD risk of the STV signal line, and the electro-static discharge electrode is located in an invalid area outside the other wiring area, and there is no overlapping area with other signal lines, so as to avoid introducing a new electro-static risk; at the same time, the electric charge accumulated on the STV signal line is released in the invalid area to improve the anti-static performance of the GOA circuit.

In view of further improving the anti-static performance of the GOA circuit, in an alternative embodiment, as shown in FIGS. 4 and 5, the GOA circuit further comprises an auxiliary signal line 123 spaced from the STV signal line 121; one end of the auxiliary signal line 123 is connected to the driver chip, and the other end thereof is electrically connected to the electro-static discharge electrode 13; the projection of the auxiliary signal line 123 on the lead area does not overlap the projection of the non-STV signal line 122 on the lead area.

In the present embodiment, the anti-static performance of the GOA circuit is further improved by arranging an auxiliary signal line 123 arranged side by side with the STV signal line 121. Specifically, the STV signal line, the auxiliary signal line and the electro-static discharge electrode are respectively provided at one of a gate layer and a source electrode and drain electrode layer of the TFT of the GOA circuit. That is, the STV signal line, the auxiliary signal line, and the electro-static discharge electrode are simultaneously formed by the process of the thin-film transistor TFT in the GOA circuit during the process, without additional manufacturing steps. Considering that the gate layer and the source and drain layer of the thin-film transistor (TFT) are metal layers, the STV signal line, the auxiliary signal line 123 and the electro-static discharge electrode are respectively disposed in the gate layer or the source and drain layer, wherein the STV signal line and the electro-static discharge electrode are disposed in different layers.

In an alternative embodiment, the STV signal line and the auxiliary signal line are disposed in a same layer, and the auxiliary signal line is electrically connected to the electro-static discharge electrode through a first via hole.

In this embodiment, the STV signal line and the auxiliary signal line are both disposed in the gate layer and the electro-static discharge electrode is disposed in the source-drain layer, and the auxiliary signal line is electrically connected to the electro-static discharge electrode through a first via hole penetrating the gate layer and the source and drain layer.

By the same reasoning, the STV signal line and the auxiliary signal line are both disposed in the source and drain layers and the electro-static discharge electrode is disposed in the gate layer, and the specific implementations are the same and will not be described in detail herein.

In another alternative embodiment, the STV signal line and the auxiliary signal line are disposed in different layers, the auxiliary signal line being electrically connected to the electro-static discharge electrode.

In the present embodiment, the STV signal line is disposed in the gate layer and the auxiliary signal line and the electro-static discharge electrode are both disposed in the source and drain layers, and the auxiliary signal line and the electro-static discharge electrode disposed in the same layer are directly electrically connected.

By the same reasoning, the STV signal line is disposed in the source and drain layer, and the auxiliary signal line and the electro-static discharge electrode are both disposed in the gate layer, and the specific implementations are the same and will not be described in detail herein.

Figure 8:
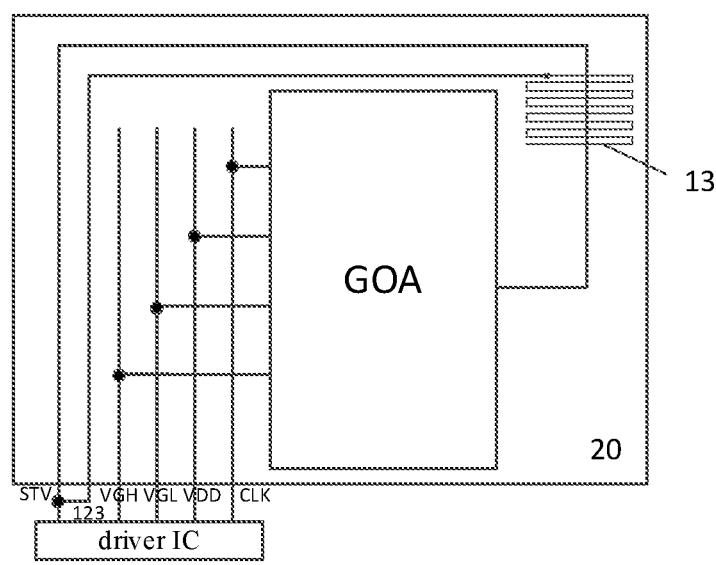
FIG. 8 shows a further circuit schematic diagram of a GOA circuit according to an embodiment of the present disclosure.

In the above-described embodiment, the anti-static performance of the GOA driver circuit can be effectively improved based on the auxiliary signal line spaced from the STV signal line. Further, FIG. 8 shows a circuit schematic diagram of GOA circuit according to a further embodiment where the auxiliary signal line and the STV signal line are connected to a same signal output port of the driver chip.

Figure 6:
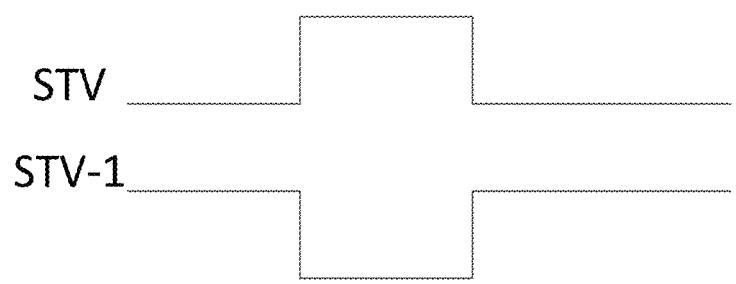
FIG. 6 shows a schematic diagram of a test signal of an STV signal line and an auxiliary signal line according to an embodiment of the present disclosure.

Specifically, as shown in FIG. 6, when a first test signal is input to the STV signal line during the process test of the GOA circuit, a second test signal with an opposite electrical polarity to the first test signal is input to the auxiliary signal line; that is, the electric charge accumulated in the process of the STV signal line is released through the process test.

In the present embodiment, for example, the first test signal is a +3V signal, the second test signal is a −3V signal, the STV signal line is a +3V electrical signal, and the electro-static discharge electrode electrically connected to the auxiliary signal line STV-1 is a −3V signal. The STV signal line and the electro-static discharge electrode form a capacitance, and the electric charge accumulated on the STV signal line is more easily discharged as the voltage difference between the two stages of the capacitance increases.

When the GOA circuit is fabricated and static electricity is released by the above-mentioned method, one end of the auxiliary signal line is electrically connected to the driver chip, then the driver chip outputs a signal to the STV signal line, and also outputs the same signal to the auxiliary signal line at the same time; then the STV signal line and the electro-static discharge electrode form a capacitance, and the two ends of the capacitance are loaded with the same voltage. When the STV signal line breaks down due to ESD, the STV signal line and the auxiliary signal line are electrically connected, and since the same signal is transmitted, the display problem of the product is not affected even if a short circuit occurs. Thus, the display abnormality problem caused by the ESD risk of the STV signal line is avoided, i.e. anti-static performance of the GOA circuit is improved.

Based on the GOA circuit described above, one embodiment of the present disclosure provides an array substrate comprising the GOA circuit described above.

In the present embodiment, the array substrate has the above-mentioned GOA circuit, and therefore, it is possible to avoid the display abnormality problem caused by the ESD problem of the STV signal line of the GOA circuit, that is, the array substrate has a high anti-static performance.

Figure 7:
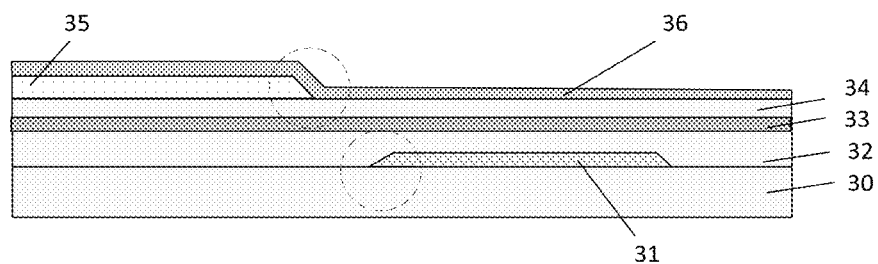
FIG. 7 shows a schematic diagram of an array substrate according to an embodiment of the present disclosure.

In an alternative embodiment, as shown in FIG. 7, the array substrate further comprises an organic film layer, forward projections of the cross-section formed by the organic film layer and the cross-section formed by each functional layer of the array substrate onto the substrate of the array substrate are set staggered.

Considering the cross-section formed between each functional layer of the array substrate, the signal lines arranged at the overlapping cross-section of each layer are easy to accumulate electric charges, especially the cross-section of the organic film layer is easy to break down when arranged overlapping, and thus, the signal lines between different layers are short-circuited, affecting the display effect of the array substrate. Therefore, in the present embodiment, the cross-sections formed by the different layers are set staggered so as to avoid that the array substrate suffers from ESD breakdown due to the cross-sectional position of the organic film layer overlapping the cross-sectional positions of the other functional layers and affects the display effect.

Specifically, as shown in FIG. 7, the array substrate comprises a base substrate 30, a gate layer 31, a gate insulation layer 32, a source and drain layer 33, a first passivation layer 34, an organic film layer 35 and a second passivation layer 36, wherein the cross-section of the gate layer 31 and the cross-section of the organic film layer 35 are set staggered, so as to effectively avoid that the array substrate suffers from ESD breakdown due to the cross-sectional position of the organic film layer overlapping the cross-sectional positions of the other functional layers and affects the display effect, and effectively improve the anti-static performance of the array substrate and improve the display effect of the array substrate.

Based on the above array substrate, one embodiment of the present disclosure provides a display device comprising the above array substrate.

In the present embodiment, the display device is a liquid crystal display device or an electroluminescent diode display device, and the display device may be any product or component with display function such as a mobile phone, a tablet computer, a television, a display, a notebook computer, digital photo frame or navigator.

As described above, the GOA circuit, the array substrate and the display device provided by the present disclosure can bypass non-STV signal lines which are arranged overlapping in the GOA circuit by optimizing the wiring position of the STV signal lines. The electro-static discharge caused by overlapping arrangement of STV signal lines and non-STV signal lines can be avoided, and the anti-static performance of GOA circuit can be improved. In particular, an electro-static discharge electrode corresponding to the STV signal line is further provided, and it is possible to effectively discharge the electric charge accumulated on the STV signal line outside the GOA area and to further reduce the electro-static risk by an auxiliary signal line arranged side by side with the STV signal line.

It is to be understood that the above-described embodiments of the present disclosure are merely illustrative of and not restrictive on the implementations of the present disclosure. For those of ordinary skill in the art to which the present disclosure pertains, many other variations and modifications are possible in the light of the above teachings. It is not intended to be exhaustive herein, and all such variations and modifications are still in the scope of protection of the present disclosure.

What is claimed is:

1. A Gate on Array (GOA) circuit comprising:
   a GOA area, wherein the GOA area comprises a plurality of GOA unit circuits cascaded with each other; and
   a lead area, wherein at least one Start Vertical (STV) signal line and at least one Non-Start Vertical (non-STV) signal line are arranged in the lead area, each STV signal line and each non-STV signal line is connected to at least one GOA unit circuit, and the non-STV signal line comprises at least one of a Vdd signal line, a clock (Clk) signal line, a Gate High Voltage (VGH) signal line and a Gate Low Voltage (VGL) signal line; a projection of the at least one STV signal line on the lead area does not overlap a projection of the at least one non-STV signal line on the lead area;
   wherein the GOA circuit further comprises an electro-static discharge electrode disposed at a different layer from the STV signal line, a projection of the electro-static discharge electrode on the lead area overlaps a projection of the STV signal line on the lead area, and a gate insulation layer is provided between the electro-static discharge electrode and the STV signal line.

2. The GOA circuit of claim 1, wherein the electro-static discharge electrode has a serpentine structure, and a width of a coverage area of the electro-static discharge electrode of the serpentine structure is not less than a width of the STV signal line.

3. The GOA circuit of claim 1, wherein the STV signal line and the non-STV signal line are connected to a driver chip respectively.

4. The GOA circuit of claim 3, further comprising an auxiliary signal line spaced from the STV signal line; wherein
   one end of the auxiliary signal line is connected to the driver chip, and the other end is electrically connected to the electro-static discharge electrode; and
   a projection of the auxiliary signal line on the lead area does not overlap the projection of the non-STV signal line on the lead area.

5. The GOA circuit of claim 4, wherein,
   the auxiliary signal line and the STV signal line are connected to a same signal output port of the driver chip.

6. The GOA circuit of claim 4, wherein,
   the STV signal line is formed in a same layer and with same material as one of a gate layer or a source electrode and drain electrode layer of a transistor in the GOA circuit;

the auxiliary signal line is formed in a same layer and with same material as one of the gate layer or the source electrode and drain electrode layer of the transistor in the GOA circuit; and the electro-static discharge electrode is formed in a same layer and with same material as one of the gate layer or the source electrode and drain electrode layer of the transistor in the GOA circuit, and the electro-static discharge electrode is disposed in a different layer from the STV signal line.

7. The GOA circuit of claim 5, wherein,
the STV signal line and the auxiliary signal line are disposed in a same layer, and the auxiliary signal line is electrically connected to the electro-static discharge electrode through a first via hole.

8. The GOA circuit of claim 5, wherein,
the STV signal line and the auxiliary signal line are disposed in different layers, and the auxiliary signal line is electrically connected to the electro-static discharge electrode.

9. The GOA circuit of claim 1, further comprising a common electrode area located at the lead area away from the GOA area; wherein
the STV signal line is led out from the driver chip and extends in a first direction of the common electrode area, bypassing the non-STV signal line and extending to the GOA area in a second direction of the common electrode area to electrically connect with the at least one GOA unit circuit, the first direction being perpendicular to the second direction.

10. An array substrate, comprising the GOA circuit of claim 1.

11. A display device, comprising the array substrate of claim 10.

* * * * *